(12) United States Patent
Hung et al.

(10) Patent No.: US 9,147,702 B2
(45) Date of Patent: Sep. 29, 2015

(54) IMAGE SENSOR FOR MITIGATING DARK CURRENT

(71) Applicant: Taiwan Semiconductor Manufacturing Company Limited, Hsin-Chu (TW)

(72) Inventors: Feng-Chi Hung, Chu-Bei (TW);
Dun-Nian Yaung, Taipei (TW);
Jen-Cheng Liu, Hsin-Chu (TW);
Shu-Ting Tsai, Kaohsiung (TW);
Shuang-Ji Tsai, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 279 days.

(21) Appl. No.: 13/769,421

(22) Filed: Feb. 18, 2013

(65) Prior Publication Data

US 2014/0231949 A1    Aug. 21, 2014

(51) Int. Cl.
*H01L 27/146* (2006.01)
(52) U.S. Cl.
CPC ......... *H01L 27/146* (2013.01); *H01L 27/14612* (2013.01); *H01L 27/14643* (2013.01); *H01L 27/14689* (2013.01)
(58) Field of Classification Search
CPC ............... H01L 27/14607; H01L 27/1461; H01L 27/14612; H01L 27/14643; H01L 27/14656; H01L 27/14689; H01L 27/14641; H01L 317/248; H01L 27/146
USPC .......... 257/53, E31.11; 348/243, 340; 438/59
See application file for complete search history.

(56) References Cited

U.S. PATENT DOCUMENTS

2012/0025199 A1    2/2012  Chen et al.
2012/0242875 A1*   9/2012  Nakamura .................... 348/294

* cited by examiner

*Primary Examiner* — Kyoung Lee
*Assistant Examiner* — Ratisha Mehta
(74) *Attorney, Agent, or Firm* — Cooper Legal Group, LLC

(57) ABSTRACT

One or more embodiments of techniques or systems for mitigating dark current of an image sensor are provided herein. Generally, a silicon interface, such as an edge of a dielectric region or an edge between a back side interface (BSI) region and a pass region, is a source of electrons or holes which cause dark current. In some embodiments, the image sensor includes a surface protect region. For example, the surface protect region is doped with a first doping type and a photo-diode of the image sensor is doped with the same first doping type. In this manner, the surface protect region acts as an electron magnet or a hole magnet for electrons or holes from the silicon interface, thus mitigating electrons or holes from the silicon interface from being collected by the photo-diode, for example.

20 Claims, 7 Drawing Sheets

IMAGE SENSOR FOR MITIGATING DARK CURRENT

BACKGROUND

Generally, an image sensor generates at least one of a voltage or a current based on a photo-diode. For example, a photo-diode collects at least one of electrons or holes from light entering the image sensor, and the image sensor generates the voltage or current accordingly. However, a silicon interface often generates at least one of electrons or holes that are not associated with the light entering the image sensor, such as dark current or white pixel noise, for example.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
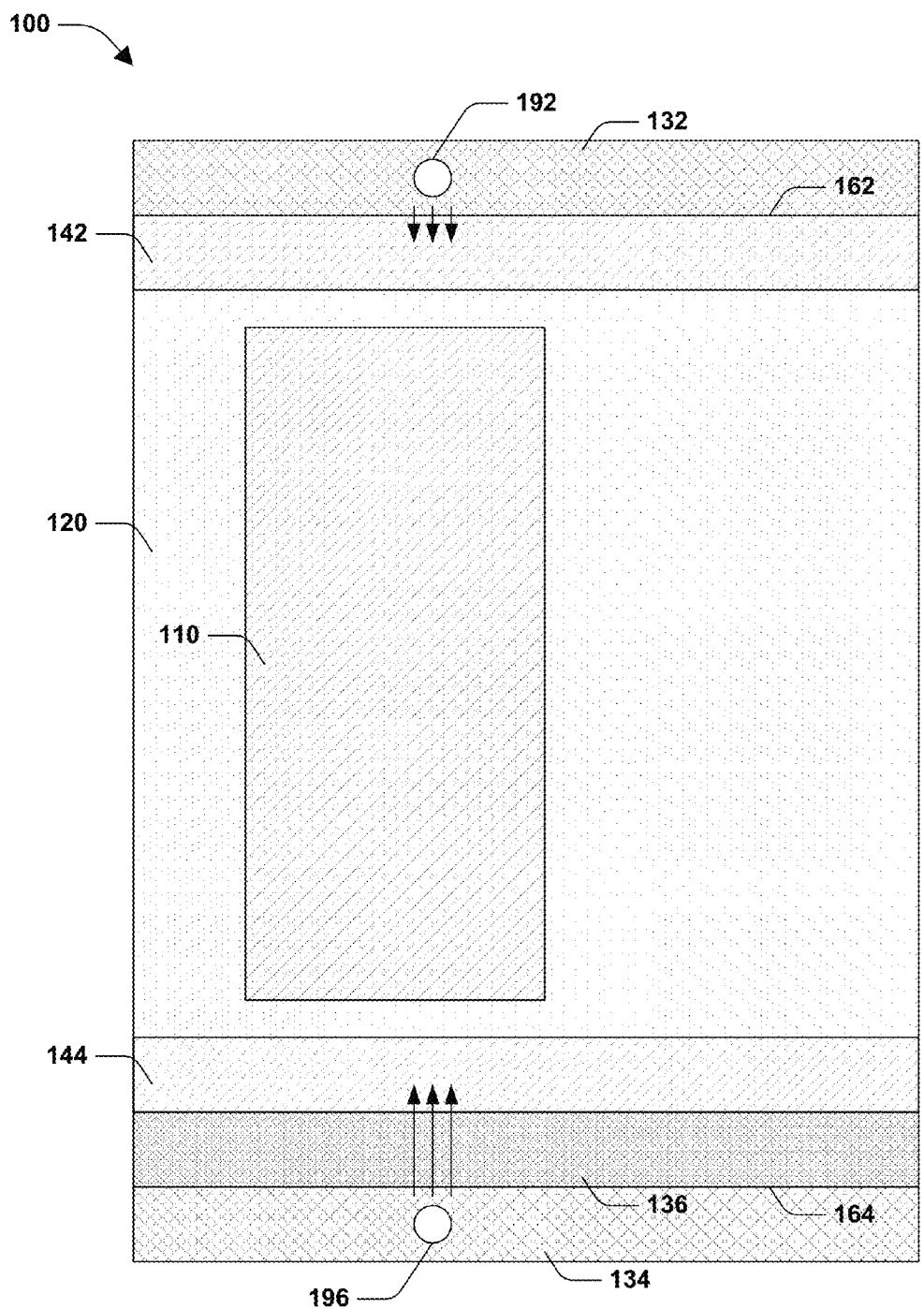
FIG. 1 is a layout or top-down view of an image sensor, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

FIG. 1 is a layout or top-down view of an image sensor 100, according to some embodiments. For example, the image sensor 100 of FIG. 1 comprises a first region 110, a second region 120, a first surface protection region 142, a second surface protect region 144, a first silicon interface 162, and a second silicon interface 164. It will be appreciated that in some embodiments, the image sensor 100 merely comprises the first silicon interface 162 and not the second silicon interface 164 or vice versa. In some embodiments, the first region 110 comprises a photo-diode. Additionally, the photo-diode of the first region 110 is configured to collect one or more electrons from light entering the image sensor 100. While the present application generally discusses operation of the image sensor 100 in terms of electrons, it will be appreciated that in other embodiments, the image sensor 100, associated components, regions, methods, etc. operate with respect to holes, such as holes of an electron-hole pair, for example. In some embodiments, the image sensor 100 is configured to generate at least one of a current or voltage based on at least some of the electrons collected by the photo-diode of the first region 110. For example, the photo-diode of the first region 110 is configured to collect an electron, such as an electron received from light passing through the image sensor 100. The first silicon interface 162 is at an edge of a dielectric region, such as dielectric region 132, for example. The second silicon interface 164 is an edge between a pass region 134 and a back side interface (BSI) region 136, for example. However, it will be appreciated that in other embodiments, at least one of the first silicon interface 162 or the second silicon interface 164 is associated with an edge of another region, such as a photo-diode side wall associated with deep trench isolation. In some examples, at least one of the first silicon interface 162 or the second silicon interface 164 is associated with a dark current electron. For example, a first dark current electron 192 is generated at the first silicon interface 162. Similarly, a second dark current electron 196 is generated at the second silicon interface 164. Accordingly, the first surface protect region 142 is configured to collect the first dark current electron 192, thus mitigating the first dark current electron 192 from being collected by the photo-diode of the first region 110. Similarly, the second surface protect region 144 is configured to collect the second dark current electron 196, thus mitigating the second dark current electron 196 from being collected by the photo-diode of the first region 110. In some embodiments, a voltage is applied to a surface protect region, such as at least one of the first surface protect region 142 or the second surface protect region 144, to create a higher potential in the surface protect region with respect to surrounding areas, such as the second region 120, thus enabling the surface protect region to block electrons from a silicon interface from flowing into a photo-diode and creating dark current or white pixels, for example. In this way, the image sensor 100 is configured to mitigate dark current, at least because dark current electrons 192 and 196 are generally collected by at least one of the first surface protect region 142 or the second surface protect region 144, and thus do not enter the photo-diode of the first region 110. Accordingly, the photo-diode of the first region 110 is configured to generally collect electrons associated with light entering the image sensor 100, for example.

In some embodiments, the first region 110 is surrounded by the second region 120. For example, the second region encompasses the first region 110. In some embodiments, at least one of the first silicon interface 162 or the second silicon interface 164 is located on at least one of a front side of the second region 120 or a back side of the second region 120. For example, at least one of the first silicon interface 162 or the dielectric region 132 is located on the front side of the second region 120. Additionally, at least one of the second silicon interface 164, the pass region 134, or the BSI region 136 is located on the back side of the second region 120. In some embodiments a surface protect region is adjacent to at least one of a silicon interface or the second region 120. For example, the first surface protect region 142 is adjacent to at least one of the second region 120 or the first silicon interface 162. Similarly, the second surface protect region 144 is adjacent to at least one of the second region 120 or the second silicon interface 164. In this way, at least one of the first surface protect region 142 or the second surface protect region 144 acts as an electron magnet or a shield for a photo-diode of the first region 110 with respect to dark current electrons from a silicon interface, such as the first dark current electron 192 from the first silicon interface 162 or the second dark current electron 196 from the second silicon interface 164. In some embodiments, a surface protect region, such as at least one of the first surface protect region 142 or the second surface protect region 144, is located within the second region 120.

In some embodiments, at least one of the first region 110, the first surface protect region 142, or the second surface protect region 144 comprises a first doping type. In some embodiments, the second region comprises a second doping type opposite of the first doping type. For example, the first region 110, the first surface protect region 142, and the second surface protect region 144 are doped with an n-type doping and the second region is doped with a p-type doping. In this example, at least one of a photo-diode of the first region 110, the first surface protect region 142, or the second surface protect region is configured to collect electrons, such as an electron from an electron-hole pair. In another example, the first region 110, the first surface protect region 142, and the second surface protect region 144 are doped with a p-type doping and the second region is doped with an n-type doping. In this example, at least one of a photo-diode of the first region 110, the first surface protect region 142, or the second surface protect region is configured to collect holes, such as a hole from an electron-hole pair.

Figure 2:
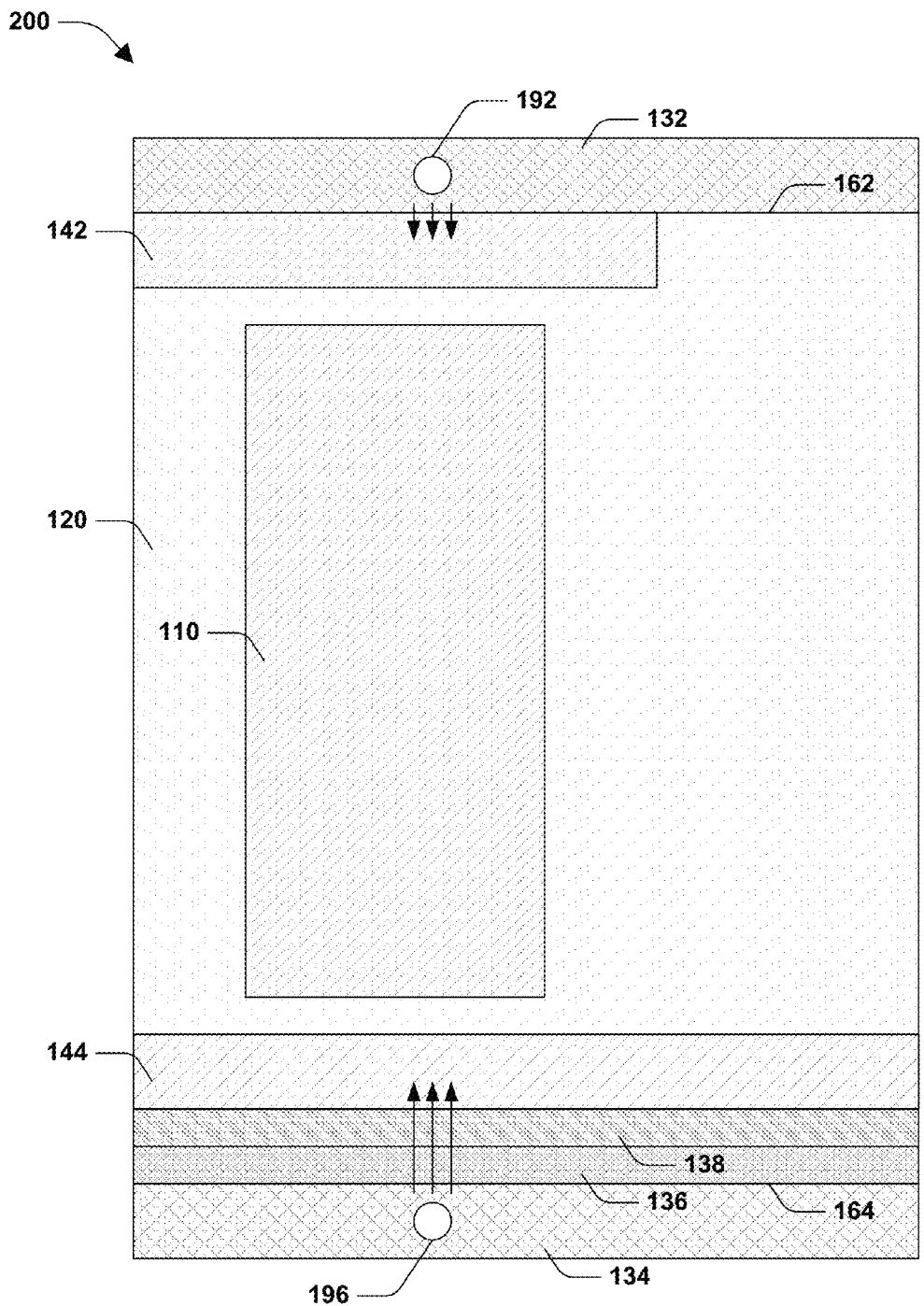
FIG. 2 is a layout or top-down view of an image sensor, according to some embodiments.

FIG. 2 is a layout or top-down view of an image sensor 200, according to some embodiments. For example, the image sensor 200 of FIG. 2 is similar to the image sensor 100 of FIG. 1, except that image sensor 200 comprises a back side p-plus region 138. Accordingly, the image sensor 200 comprises a dielectric region 132, a first silicon interface 162, a first surface protect region 142, a second region 120, a first region 110, a second surface protect region 144, the back side p-plus region 138, a back side interface (BSI) region 136, a pass region 134, and a second silicon interface 164. In some embodiments, the back side p-plus region 138 is formed between at least one of the second surface protect region 144 and the BSI region 136. In some embodiments, the back side p-plus region 138 is formed between at least one of the first region 110 and the BSI region 136.

In some embodiments, the first region 110 comprises a photo-diode configured to collect electrons from light entering the image sensor 200. The image sensor 200 is configured to generate at least one of a current or voltage based on at least some of the electrons collected by the photo-diode of the first region 110, for example. The image sensor 200 comprises a first silicon interface 162 and a second silicon interface 164. In some embodiments, the image sensor comprises a number of silicon interfaces other than two, as the first silicon interface 162 and the second silicon interface 164 are merely examples. An edge of a dielectric region 132 is associated with the first silicon interface 162, for example. Similarly, an edge between a pass region 134 and a back side interface (BSI) region 136 is associated with the second silicon interface 164, for example. Generally, a silicon interface, such as the first silicon interface 162 or the second silicon interface 164, is associated with a dark current electron, such as a first dark current electron 192 or a second dark current electron 196. In some embodiments, a surface protect region is configured to collect an electron, such as a dark current electron from a silicon interface. For example, the first surface protect region 142 is configured to collect electrons from the first silicon interface 162, such as the first dark current electron 192. Similarly, the second surface protect region 144 is configured to collect electrons from the second silicon interface 164, such as the second dark current electron 196. In this way, dark current for a photo-diode of the first region 110 is thus mitigated, at least because dark current electrons, such as the first dark current electron 192 and the second dark current electron 196 are collected by respective surface protect regions 142 and 144. In some embodiments, a voltage is applied to at least one of the first surface protect region 142 or the second surface protect region 144 to create a potential difference between the respective surface protect regions and the second region 120, for example. Accordingly, at least one of the first surface protect region 142 or the second surface protect region 144 comprises a higher potential than the second region 120, thus enabling the respective surface protect regions to trap electrons which would otherwise likely be collected by a photo-diode of the first region 110. An electron associated with light entering the image sensor 200 is thus collected by the photo-diode of the first region 110 without interference from dark current of the respective silicon interfaces 162 and 164.

Figure 3:
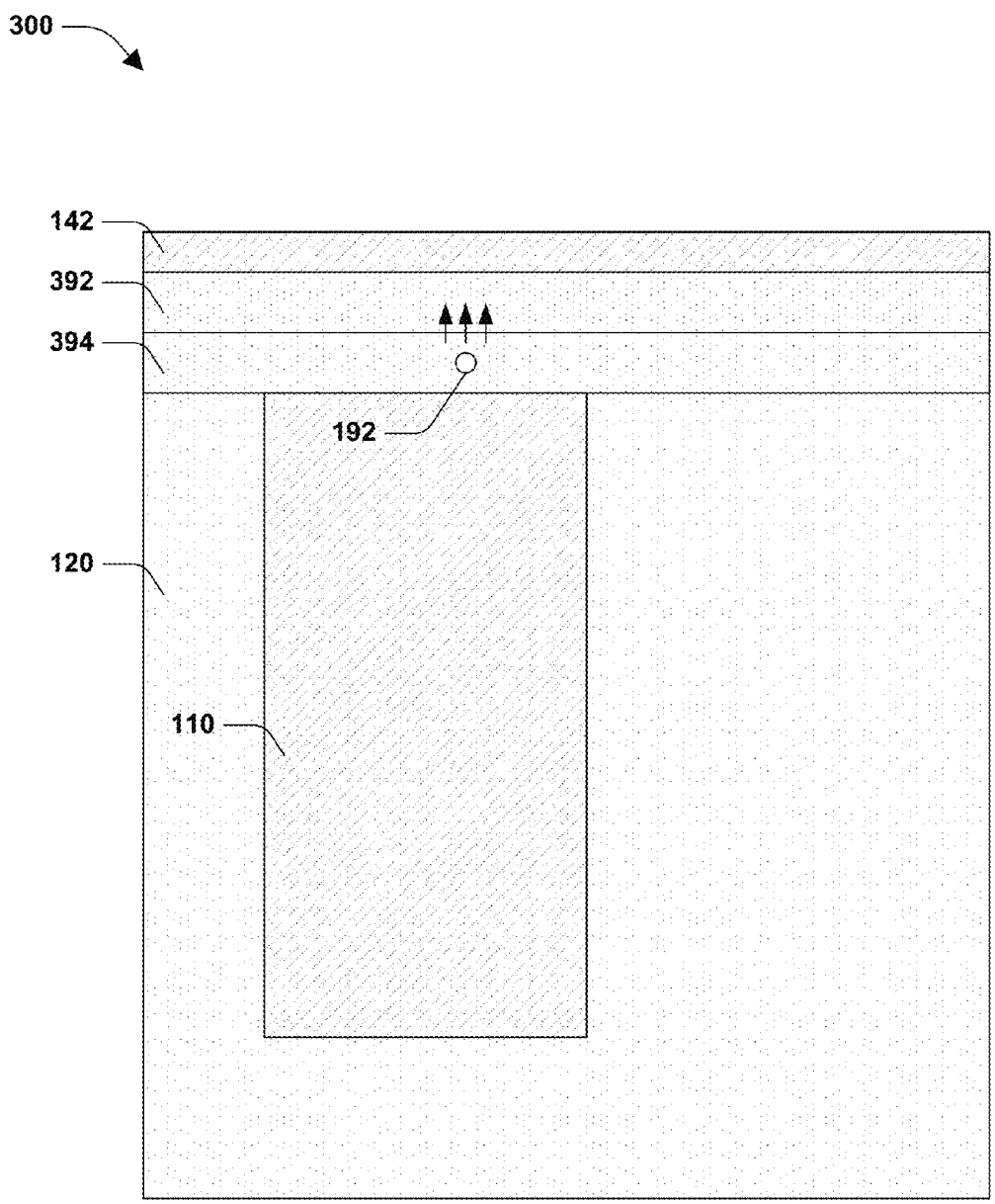
FIG. 3 is a layout or top-down view of an image sensor, according to some embodiments.

FIG. 3 is a layout or top-down view of an image sensor 300, according to some embodiments. The image sensor 300 of FIG. 3 comprises a first region 110, a second region 120, and a first surface protect region 142. In some embodiments, the second region comprises a first sub-region 394 and a second sub-region 392. For example, respective sub-regions are located between the first region 110 and the first surface protect region 142. It will be appreciated that in some embodiments, one or more sub-regions are formed between the first region 110 and the first surface protect region 142 such that any number of sub-regions are formed. For example, an area between the first region 110 and the first surface protect region 142 comprises at least one of one sub-region, two sub-regions, three sub-regions, four sub-regions, any number of sub-regions, etc. In some embodiments, a third region comprises respective sub-regions. In FIG. 3, the third region comprises the first sub-region 394 and the second sub-region 392, for example. In some embodiments, the third region is doped in a non-uniform manner. For example, the first sub-region 394 of the third region comprises a first doping concentration and the second sub-region 392 of the third region comprises a second doping concentration different than the first doping concentration of the first sub-region 394. According to some aspects, the first sub-region 394 is adjacent to at least one of the first region 110 or the second sub-region 392. Additionally, the second sub-region 392 is adjacent to at least one of the first sub-region 394 or the first surface protect region 142. In some embodiments, the first doping concentration of the first sub-region 394 is greater than the second doping concentration of the second sub-region 392. For example, the first sub-region 394 and the second sub-region 392 are doped with a first implant and merely the first sub-region 394 is doped with a second implant. In this way, the third region is doped in a non-uniform manner, at least because third region comprises the first sub-region 394 and the second sub-region 392.

Generally, an electron will gravitate towards a lower energy potential as opposed to a higher energy potential. In FIG. 3, when the first sub-region 394 is doped with a first doping concentration greater than a second doping concentration of the second sub-region 392, the first sub-region 394 is thus associated with a higher energy potential relative to an energy potential associated with the second sub-region 392. Accordingly, the third region is configured to repel an electron, such as electron 192, away from a photo-diode of the first region 110. For example, the electron 192 is a dark current electron associated with a silicon interface, such as the first silicon interface 162 of FIG. 2. In some embodiments, the electron 192 "rolls" from a higher energy level of the first sub-region 394 to a lower energy level of the second sub-region 392, at least because the first sub-region 394 is associated with a first doping concentration greater than a second doping concentration of the second sub-region 392 and a higher doping concentration of the first sub-region 394 results in a corresponding higher energy potential. In some embodiments, the first sub-region 394 is arranged closer to the first region 110 than other sub-regions, such as the second sub-region 392. In some embodiments, the second sub-region 392 is arranged closer to the first surface protect region 142 than other sub-regions, such as the first sub-region 394. In this way, the third region comprising the first sub-region 394 and the second sub-region 392 is doped in a non-uniform fashion to create a non-uniform energy potential such that an electron within the third region is directed away from the photo-diode of the first region 110, for example.

Figure 4:
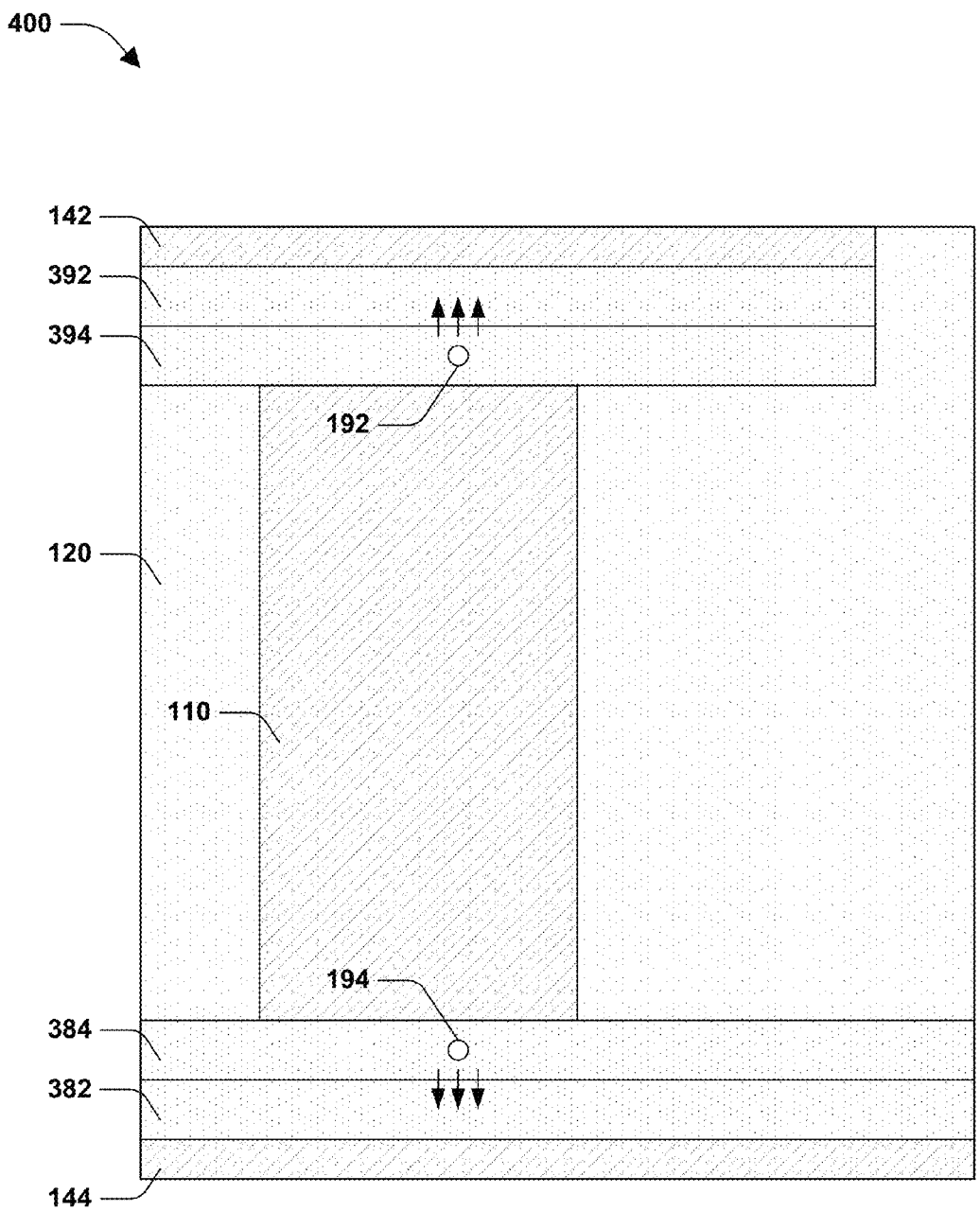
FIG. 4 is a layout or top-down view of an image sensor, according to some embodiments.

FIG. 4 is a layout or top-down view of an image sensor 400, according to some embodiments. In some examples, the image sensor 400 is similar to the image sensor 300 of FIG. 3, except that the image sensor 400 of FIG. 4 comprises a fourth region comprising a first sub-region 384 and a second sub-region 382. It will be appreciated that a first surface protect region 142 is not necessarily a same length as a second surface protect region 144 in some embodiments. For example, the first surface protect region 142 is a different length than the second surface protect region 144.

In some embodiments, the image sensor 400 comprises a first surface protect region 142, a second surface protect region 144, a first region 110, a second region 120, a third region, and a fourth region. For example, the third region comprises a first sub-region 394 and a second sub-region 392 and the fourth region comprises a first sub-region 384 and a second sub-region 382. In some embodiments, the first region 110, the first surface protect region 142, and the second surface protect region 144 comprise a first doping type and the second region 120 comprises a second doping type. In other embodiments, the first region 110, the first surface protect region 142, and the second surface protect region 144 comprise the second doping type and the second region 120 comprises the first doping type. In some embodiments at least one of the third region or the fourth region is adjacent to at least one of a surface protect region or the first region 110. For example, the third region is adjacent to the first surface protect region 142 and the first region 110 and the fourth region is adjacent to the second surface protect region 144 and the first region 110. It will be appreciated that a sub-region closer to the first region 110 comprises a doping concentration different than a doping concentration of a sub-region closer to a surface protect region, for example. Accordingly, the first sub-region 394 of the third region comprises a first doping concentration and the second sub-region 392 of the third region comprises a second doping concentration different than the first doping concentration of the first sub-region 394. Similarly, the first sub-region 384 of the fourth region comprises a first doping concentration and the second sub-region 382 of the fourth region comprises a second doping concentration different than the first doping concentration of the first sub-region 384. For example, for the third region, the first doping concentration of the first sub-region 394 is greater than the second doping concentration of the second sub-region 392. Similarly, for the fourth region, the first doping concentration of the first sub-region 384 is greater than the second doping concentration of the second sub-region 382. In some embodiments, electrons 192 and 194 are dark current electrons associated with a silicon interface. For example, electron 192 is repelled from the first sub-region 394 of the third region to the second sub-region 392 of the third region. In some embodiments, electron 192 is driven from the second sub-region 392 of the third region and collected by the first surface protect region 142. Similarly, electron 194 is repelled from the first sub-region 384 of the fourth region to the second sub-region 382 of the fourth region. In some embodiments, electron 194 is driven from the second sub-region 382 of the fourth region and collected by the second surface protect region 144. In this way, dark current is mitigated for the image sensor 400 of FIG. 4, at least because dark current electrons 192 and 194 are not collected by the photo-diode of the first region 110.

In some embodiments, at least one of the second sub-region 392 of the second region or the second sub-region 382 of the fourth region is associated with a same implant type as the photo-diode of the first region 110. In some embodiments, a voltage is applied to at least one of the second sub-region 392 of the second region or the second sub-region 382 of the fourth region to mitigate dark current. For example, at least one of the second sub-region 392 or the second sub-region 382 is configured to collect dark current electrons, thus mitigating dark current electrons from being collected by the photo-diode of the first region 110. In some embodiments, the applied voltage creates a higher potential in sub-regions 382 and 392 with respect to surrounding areas, thus enabling the surface protect region to block electrons from a silicon interface from flowing into a photo-diode and creating dark current or white pixels, for example.

Figure 5:
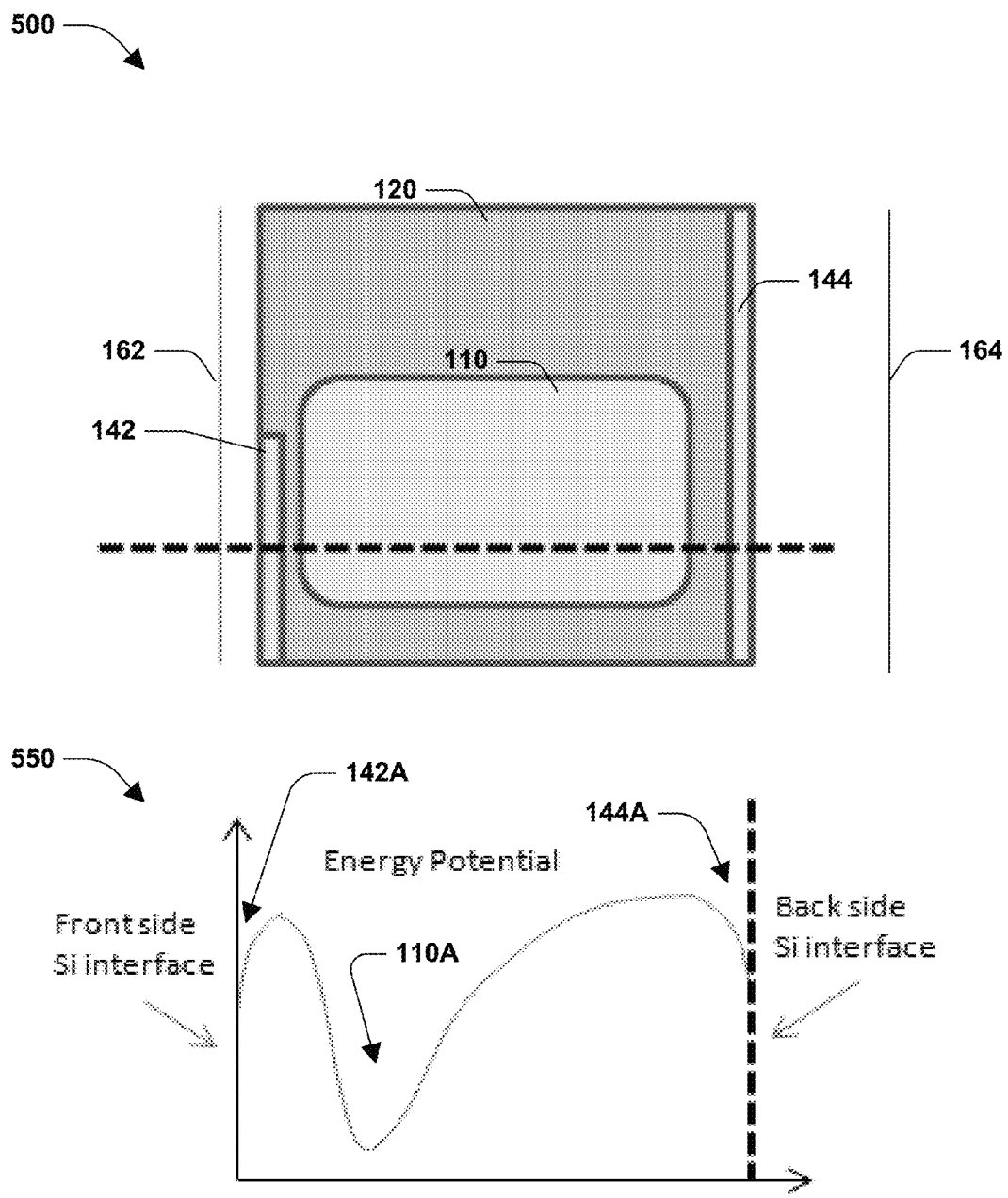
FIG. 5 is a layout or top-down view of an image sensor and a corresponding energy diagram, according to some embodiments.

FIG. 5 is a layout or top-down view of an image sensor 500 and a corresponding example energy diagram 550, according to some embodiments. It will be appreciated that the image sensor 500 of FIG. 5 is rotated ninety degrees counter clockwise relative to FIGS. 1-4 in order to discuss the image sensor 500 with respect to the energy diagram 550. For example, an "x" axis for the image sensor 500 maps to the "x" axis for the energy diagram 550. In some embodiments, the image sensor 500 of FIG. 5 comprises a first region 110, a second region 120, a first surface protect region 142, a second surface protect region 144, a first silicon interface 162, and a second silicon interface 164. Additionally, energy diagram 550 corresponds to a layout of the image sensor 500. For example, a first energy potential well 142A corresponds to the first surface protect region 142. Additionally, a second energy potential well 110A corresponds to the first region 110, at least because the first region 110 comprises a photo-diode. Additionally, a third energy potential well 144A corresponds to the second surface protect region 144. Therefore, since an electron is generally drawn toward a lower energy potential, such as at least one of the first energy potential well 142A, the second energy potential well 110A, or the third energy potential well 144A, electrons associated with at least one of the first silicon interface 162 or the second silicon interface 164 are collected by at least one of the first surface protect region 142 or the second surface protect region 144 via the first energy potential well 142A or the third energy potential well 144A. Accordingly, electrons not associated with light passing through the image sensor 500 are mitigated from being collected by the photo-diode of the first region 110, such as electrons associated with at least one of the first silicon interface 162 or the second silicon interface 164. In some embodiments, the first surface protect region 142 is located on a front side of a silicon interface, such as the first silicon interface 162 and the second surface protect region 144 is located on a back side of a silicon interface, such as the second silicon interface 164.

In some embodiments, an image sensor 500 comprises two or more energy potential wells, such as energy potential wells 110A, 142A, or 144A. In some embodiments, one or more of the energy potential wells is positioned at an edge of the image sensor 500, for example. In this way, the energy potential well at the edge mitigates dark current by collecting dark current electrons. For example, the edge energy potential well, such as at least one of 142A or 144A, is configured to mitigate dark current electrons from entering the photo-diode energy potential well 110A. In this way, the image sensor 500 is associated with two or more energy potential wells.

Figure 6:
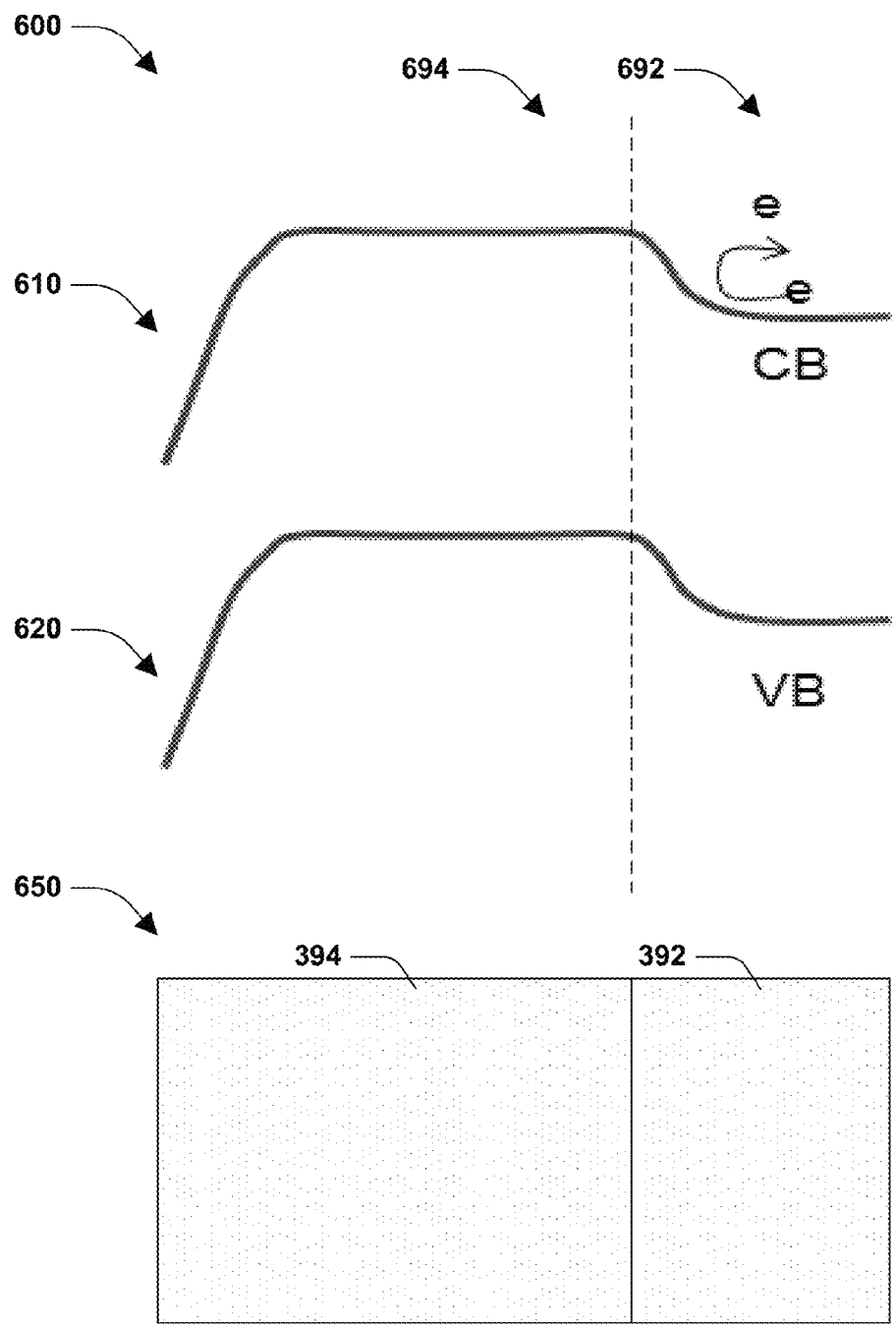
FIG. 6 is an energy diagram and a corresponding image sensor, according to some embodiments.

FIG. 6 is an energy diagram 600 and a corresponding image sensor 650, according to some embodiments. For example, 620 is an illustration of an example valence band associated with non-uniform doping of at least one of a third region or a fourth region, such as the third region or the fourth region of FIG. 4. Additionally, 610 is an illustration of an example conduction band associated with non-uniform doping of at least one of a third region or a fourth region, such as the third region or the fourth region of FIG. 4. It will be appreciated that a first portion of respective energy bands is associated with 694 and that the first portion 694 corresponds to a first sub-region, such as first sub-region 394. Similarly, it will be appreciated that a second portion of respective energy bands is associated with 692 and that the second portion 692 corresponds to a second sub-region, such as second sub-region 392. In some embodiments, a third region 650 comprises the first sub-region 394 and the second sub-region 392. Additionally, the first sub-region 394 comprises a first doping concentration and the second sub-region 392 comprises a second doping concentration different than the first doping concentration of the first sub-region 394. In some embodiments, the first sub-region 394 comprises a first doping concentration greater than a second doping concentration of the second sub-region 392. Additionally, the first sub-region 394 is arranged closer to a photo-diode, such as a photo-diode of first region 110 of FIG. 2, than the second sub-region 392, for example. In some embodiments, the second sub-region 392 is arranged closer to at least one of a silicon interface or a surface protect region, such as the first silicon interface 162 or the first surface protect region 142 of FIG. 2, than the first sub-region 394, for example. In some embodiments, the first sub-region 394 and the second sub-region 392 are doped with a first implant and merely the first sub-region 394 is doped with a second implant to create the non-uniform doping effect within the third region 650. For example, electrons arriving at the third region 650 are generally produced from a silicon interface, such as the first silicon interface 162 of FIG. 2, and associated with dark current. Accordingly, electrons in the first portion 694 of at least one of the valence band 620 or the conduction band 610 "roll" back towards the second portion 692. In other words, electrons in the first sub-region 394 of the third region 650 are driven towards the second sub-region 392 of the third region 650, and thus driven away from a photo-diode, such as the photo-diode of the first region 110 of FIG. 2, at least because the energy diagram 600 corresponds with a doping concentration of the third region 650, for example. In this way, at least one of a doping profile, doping concentration, energy profile, or energy potential associated with at least one of the third region 650, the first sub-region 394, or the second sub-region 392 is adjusted.

Figure 7:
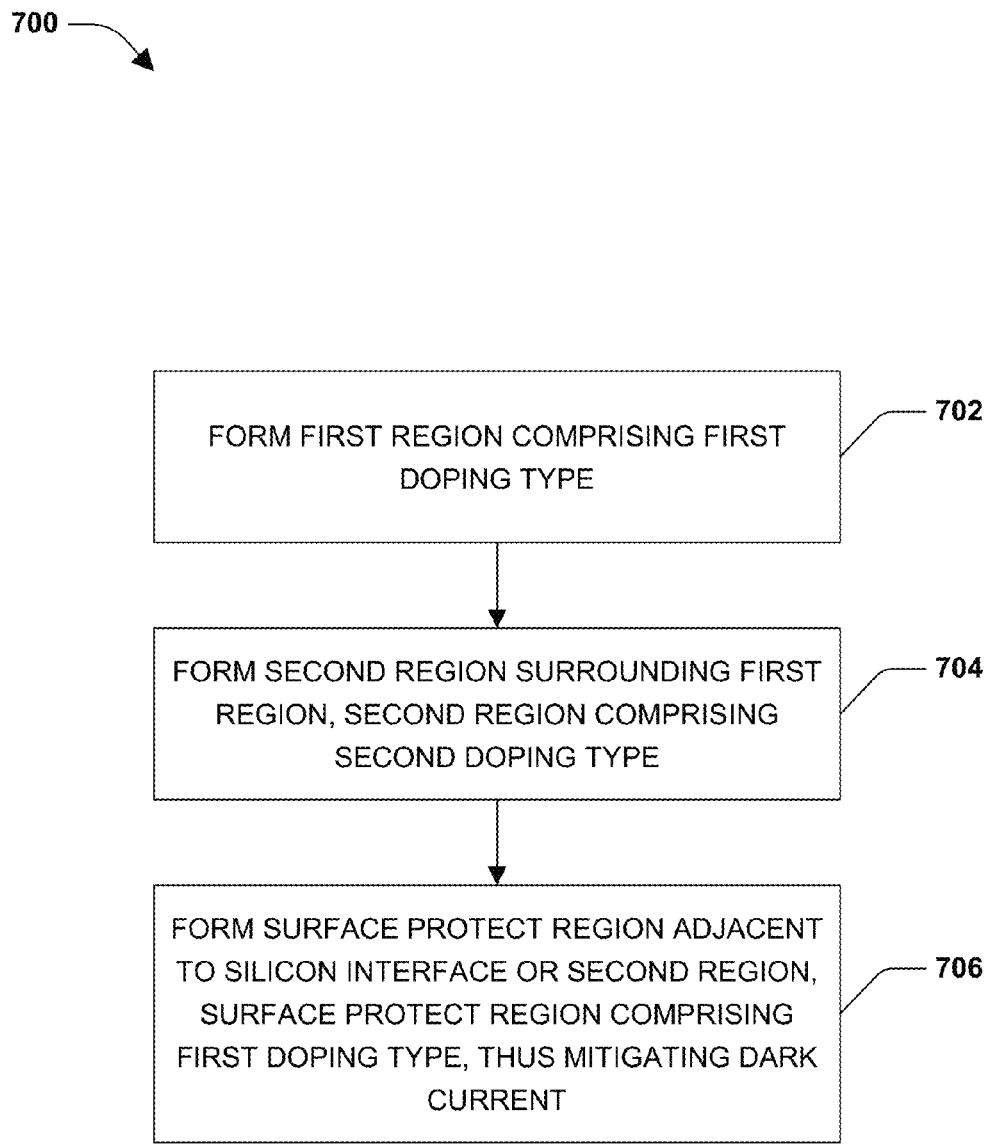
FIG. 7 is a flow diagram of a method for mitigating dark current, according to some embodiments.

FIG. 7 is a flow diagram of a method 700 for mitigating dark current, according to some embodiments. In some embodiments, the method 700 comprises forming a first region comprising a first doping type at 702. Additionally, the method 700 comprises forming a second region surrounding the first region, the second region comprising a second doping type at 704. For example, the second doping type is opposite of the first doping type, such as p-type versus n-type. In some embodiments, the method 700 comprises forming a surface protect region adjacent to at least one of a silicon interface or the second region, the surface protect region comprising the first doping type, thus mitigating dark current at 706.

According to some aspects, the method 700 comprises doping the first doping type with n-type doping and doping the second doping type with p-type doping. According to other aspects, the method 700 comprises doping the first doping type with p-type doping and doping the second doping type with n-type doping. In some embodiments, a back side p-plus region is formed between the first region and a back side interface (BSI) region. In some embodiments, forming the first region comprises forming a photo-diode. In some example embodiments, a third region is doped in a non-uniform manner. For example, forming the second region comprises forming a third region adjacent to at least one of the surface protect region or the first region. Additionally, the third region comprises a first sub-region and a second sub-region. The third region is doped in a non-uniform manner in some embodiments. For example, the first sub-region is doped to comprise a first doping concentration and the second sub-region is doped to comprise a second doping concentration different than the first doping concentration. According to some aspects, the first and second sub-regions are arranged to direct electrons away from a photo-diode. For example, the method 700 comprises at least one of arranging the first sub-region closer to the first region than the second sub-region or arranging the second sub-region closer to the surface protect region than the first sub-region. In some embodiments, a surface protect region is placed on at least one of a front side or a back side of an image sensor to mitigate edge effects from dark current electrons of a silicon interface. Therefore, a higher energy potential is created by non-uniform doping of a region or a surface protect region to block electrons from reaching a photo-diode, such as a photo-diode of first region 110 of FIG. 2, for example.

It will be appreciated that in some embodiments, at least one of an image sensor, a photo-diode, a surface protect region collects at least one of an electron or a hole. Similarly, it will be appreciated that a silicon interface generates at least one of an electron or a hole. In some examples, the image sensor, the photo-diode, the surface protect region, the silicon interface, etc. are described with in terms of electrons, such as the photo-diode collecting an electron. However, it will be appreciated that in other examples, the image sensor, the photo-diode, the surface protect region, the silicon interface, etc. operate based on holes rather than electrons, for example. In other words, a component, such as the photo-diode, etc., is configured to collect holes rather than electrons in some embodiments.

One or more embodiments of techniques or systems for mitigating dark current of an image sensor are provided herein. In some embodiments, the image sensor comprises a surface protect region doped with a first doping type. Additionally, a photo-diode of the image sensor is doped with the same first doping type as the surface protect region. In this manner, the surface protect region is configured to mitigate dark current electrons or holes from entering the photo-diode, for example. Additionally, pixel performance is improved, at least due to a reduced amount of dark current electrons or holes entering the photo-diode, thereby mitigating false positive signals associated with at least some of the dark current electrons or holes.

In some embodiments, an image sensor comprises a photo-diode, a silicon interface, and a surface protect region. For example, the image sensor generates at least one of a current or a voltage based on electrons collected by the photo-diode. In some embodiments, the photo-diode is doped with a first doping type. Generally, a first source of at least some of the electrons is light entering the image sensor, such as via a pass region or a back side interface (BSI) region, for example.

However, a second source of at least some of the electrons is the silicon interface, for example. Accordingly, the surface protect region is doped with the same first doping type as the photo-diode and configured to collect at least some of the electrons associated with the silicon interface, thus mitigating dark current associated with edge effects at least because at least some of the electrons generated by the silicon interface are collected by the surface protect region, rather than the photo-diode.

According to some aspects, an image sensor for mitigating dark current is provided, comprising a first region comprising a first doping type. In some embodiments, the image sensor comprises a second region comprising a second doping type. For example, the second doping type is opposite of the first doping type and the first region surrounded by the second region. In some embodiments, the image sensor comprises a silicon interface comprising at least one of an edge between the first region and a dielectric region or an edge between a back side interface (BSI) region and a pass region. Additionally, the silicon interface is located on at least one of a front side of the second region or a back side of the second region. In some embodiments, the image sensor comprises a surface protect region comprising the first doping type. For example, the surface protect region is adjacent to at least one of the silicon interface or the second region, thus mitigating dark current.

According to some aspects, a method for mitigating dark current of an image sensor is provided, comprising forming a first region comprising a first doping type. In some embodiments, the method comprises forming a second region surrounding the first region, the second region comprising a second doping type, the second doping type opposite of the first doping type. In some embodiments, the method comprises forming a surface protect region adjacent to at least one of a silicon interface or the second region, the surface protect region comprising the first doping type, thus mitigating dark current.

According to some aspects, an image sensor for mitigating dark current is provided, comprising a first region comprising a first doping type. In some embodiments, the image sensor comprises a second region comprising a second doping type, the second doping type opposite of the first doping type, the first region surrounded by the second region. In some embodiments, the image sensor comprises a first silicon interface comprising an edge between the first region and a dielectric region, the first silicon interface located on a front side of the second region. In some embodiments, the image sensor comprises a second silicon interface comprising an edge between a back side interface (BSI) region and a pass region, the second silicon interface located on a back side of the second region. In some embodiments, the image sensor comprises a first surface protect region comprising the first doping type, the first surface protect region adjacent to at least one of the first silicon interface or the second region. In some embodiments, the image sensor comprises a second surface protect region comprising the first doping type, the second surface protect region adjacent to at least one of the second silicon interface or the second region, thus mitigating dark current.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An image sensor for mitigating dark current, comprising:
    a first region comprising a first doping type;
    a second region comprising a second doping type, the second doping type opposite of the first doping type, the first region surrounded by the second region;
    a first surface protect region above the second region and comprising the first doping type;
    a first silicon interface comprising an edge between the first surface protect region and a dielectric region above the first surface protect region;
    a second surface protect region below the second region and comprising the first doping type; and
    a second silicon interface comprising an edge between a back side interface (BSI) region and a pass region below the second surface protect region.

2. The image sensor of claim 1, the first doping type comprising n-type doping, the second doping type comprising p-type doping.

3. The image sensor of claim 1, the first doping type comprising p-type doping, the second doping type comprising n-type doping.

4. The image sensor of claim 1, comprising a back side p-plus region between the second surface protect region and the BSI region.

5. The image sensor of claim 1, the first region comprising a photo-diode.

6. The image sensor of claim 1, comprising a third region adjacent to the first region, the third region comprising:
    a first sub-region; and
    a second sub-region.

7. The image sensor of claim 6, the third region doped in a non-uniform manner such that:
    the first sub-region comprises a first doping concentration; and
    the second sub-region comprises a second doping concentration different than the first doping concentration.

8. The image sensor of claim 6, the first sub-region adjacent to the first region and the second sub-region adjacent to at least one of the first surface protect region or the second surface protect region.

9. The image sensor of claim 6, a first doping concentration of the first sub-region greater than a second doping concentration of the second sub-region.

10. The image sensor of claim 1, the second region in contact with the first surface protect region and the dielectric region.

11. A method for mitigating dark current of an image sensor, comprising:
forming a first region comprising a first doping type;
forming a second region surrounding the first region, the second region comprising a second doping type, the second doping type opposite of the first doping type;
forming a third region at least one of above the first region or below the first region, comprising:
forming a first sub-region comprising the first doping type adjacent to the second region; and
forming a second sub-region comprising the first doping type adjacent to the first sub-region, wherein a second doping concentration of the second sub-region is less than a first doping concentration of the first sub-region; and
forming a surface protect region adjacent to the second sub-region, the surface protect region comprising the first doping type.

12. The method of claim 11, the first doping type comprising n-type doping, and the second doping type comprising p-type doping.

13. The method of claim 11, the first doping type comprising p-type doping, and the second doping type comprising n-type doping.

14. The method of claim 11, comprising forming a back side p-plus region between the first region and a back side interface (BSI) region.

15. The method of claim 11, forming the first region comprising forming a photo-diode.

16. An image sensor for mitigating dark current, comprising:
a first region comprising a first doping type;
a second region comprising a second doping type, the second doping type opposite of the first doping type, the first region surrounded by the second region;
a third region at least one of above the first region or below the first region, the third region comprising:
a first sub-region adjacent to the second region and comprising the first doping type; and
a second sub-region adjacent to the first sub-region and comprising the first doping type; and
a first surface protect region comprising the first doping type, the first surface protect region adjacent to the second sub-region.

17. The image sensor of claim 16, the third region above the first region and the image sensor comprising:
a fourth region below the first region, the fourth region comprising:
a third sub-region adjacent to the second region and comprising the first doping type; and
a fourth sub-region adjacent to the third sub-region and comprising the first doping type.

18. The image sensor of claim 17, comprising a second surface protect region adjacent to the fourth sub-region.

19. The image sensor of claim 17, wherein:
a second doping concentration of the second sub-region is less than a first doping concentration of the first sub-region; and
a fourth doping concentration of the fourth sub-region is less than a third doping concentration of the third sub-region.

20. The image sensor of claim 16, the second region in contact with the first sub-region, the second sub-region, and the first surface protect region.

* * * * *